United States Patent [19]

Sumiyoshi

[11] Patent Number: 5,072,298
[45] Date of Patent: Dec. 10, 1991

[54] AUTO-TUNING CIRCUIT FOR AN ACTIVE FILTER USED IN VIDEO SIGNAL PROCESSING

[75] Inventor: Hajime Sumiyoshi, Fukaya, Japan

[73] Assignee: Kabushiki Kaisha Toshiba, Kawasaki, Japan

[21] Appl. No.: 589,611

[22] Filed: Sep. 28, 1990

[30] Foreign Application Priority Data

Sep. 28, 1989 [JP] Japan .................................. 1-250656

[51] Int. Cl.⁵ .............................................. H04N 5/04
[52] U.S. Cl. ...................................... 358/158; 331/14
[58] Field of Search ...................... 358/191.1, 38, 148, 358/158, 159; 331/14, 20; 330/303

[56] References Cited

U.S. PATENT DOCUMENTS

| | | | |
|---|---|---|---|
| 3,793,594 | 2/1974 | Griswold | 331/14 X |
| 4,123,726 | 10/1978 | Schucht | 331/14 |
| 4,748,422 | 5/1988 | Matsumoto et al. | |
| 4,802,009 | 1/1989 | Hartmeier | 358/158 |
| 4,812,783 | 3/1989 | Honjo et al. | 358/158 X |
| 4,884,040 | 11/1989 | Fling | 331/14 X |
| 4,958,228 | 9/1990 | Kutsuki | 358/158 |

OTHER PUBLICATIONS

K. Moulding et al., "Gyrator Video Filter IC with Automatic Tuning", IEEE Journal of Solid-State Circuits, vol. SC-15, No. 6, Dec., 1980.

Primary Examiner—Victor R. Kostak
Attorney, Agent, or Firm—Cushman, Darby & Cushman

[57] ABSTRACT

An auto-tuning circuit for automatically adjusting the transfer function of an active filter for processing video signals. A voltage-controlled filter is used as active filter, for imparting a predetermined transfer characteristic to a signal having a component related to a television signal. The transfer characteristic can be adjusted in accordance with a voltage. The auto-tuning circuit comprises PLL section connected to the voltage-controlled filter, and switching circuit. The PLL section applies to the voltage-controlled filter a control voltage corresponding to the phase difference between a reference signal and an output signal obtained by passing the reference signal through the voltage-controlled filter. The switching section allows transfer of signals between the voltage-controlled filter and the PLL section for at least one of the horizontal blanking period and vertical blanking period of the television signal.

21 Claims, 8 Drawing Sheets

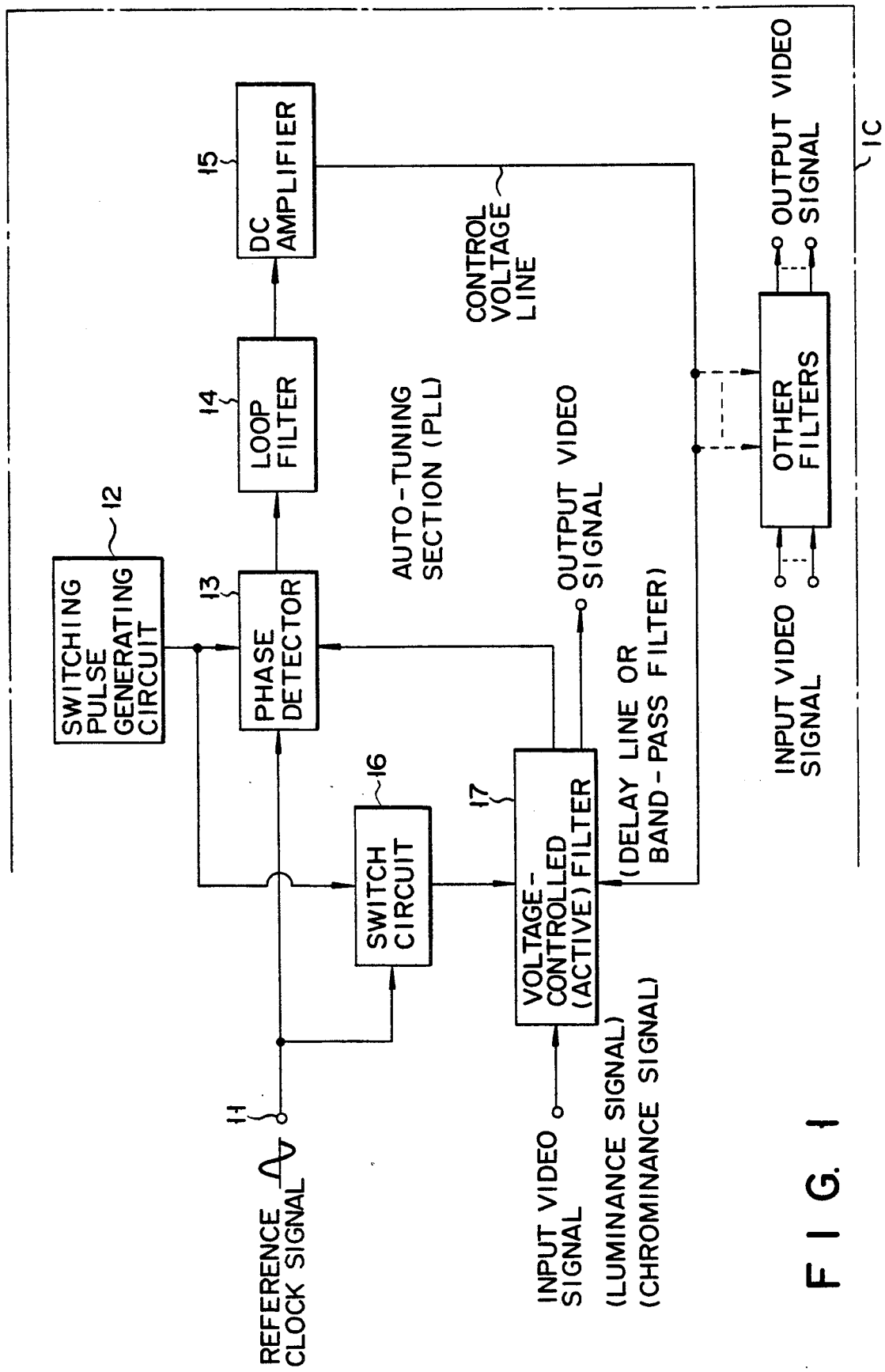
F I G. 1

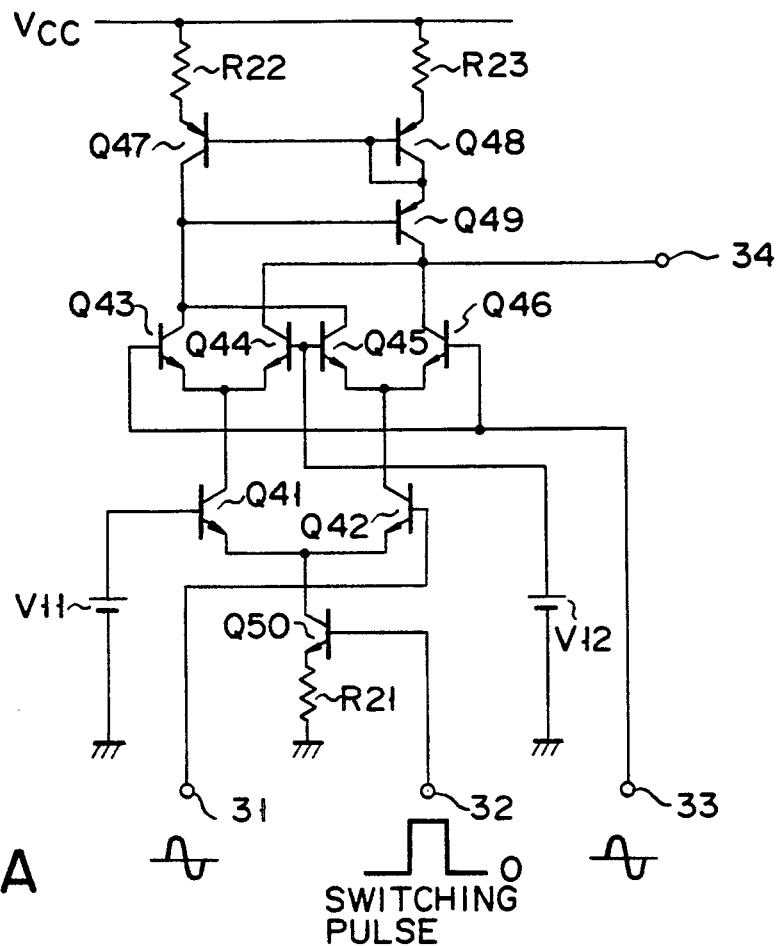
F I G. 2A
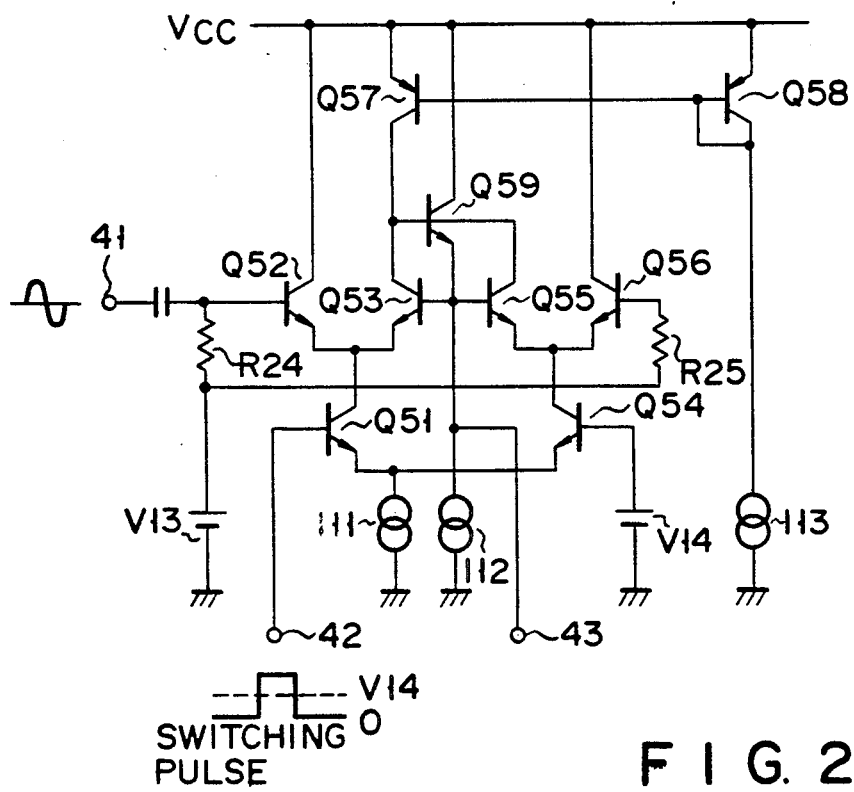
F I G. 2B

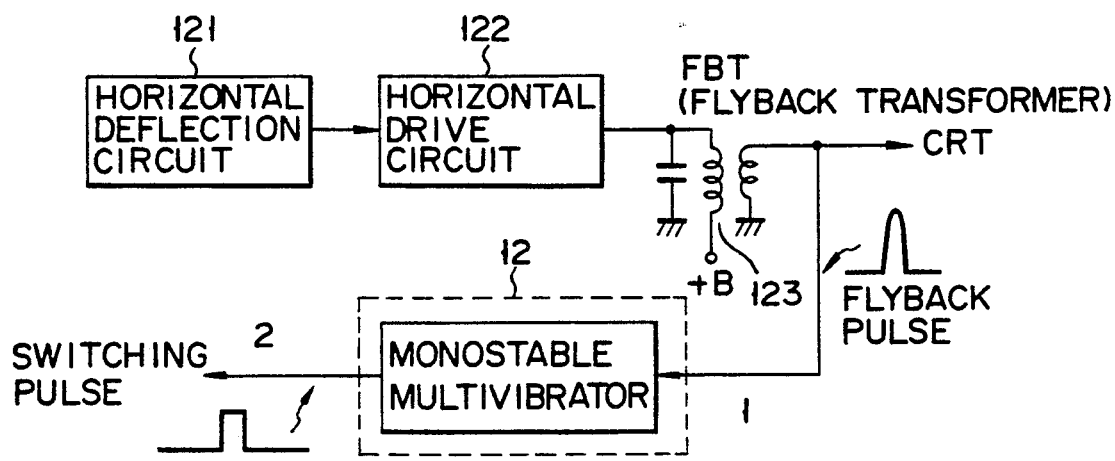
F I G. 2F
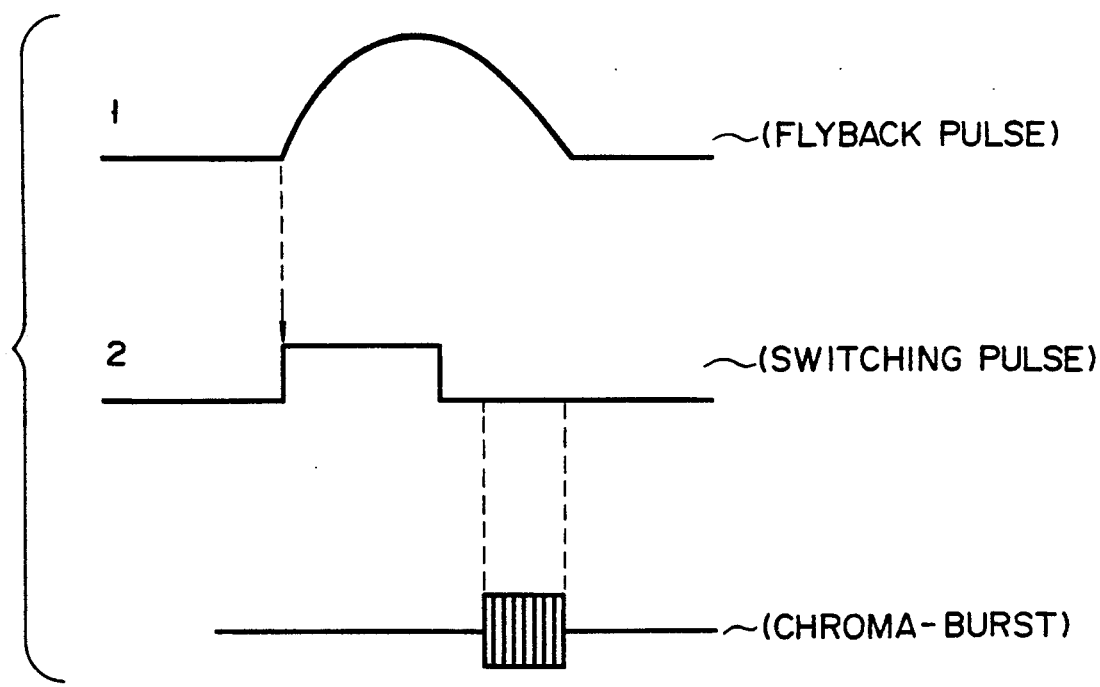
F I G. 3

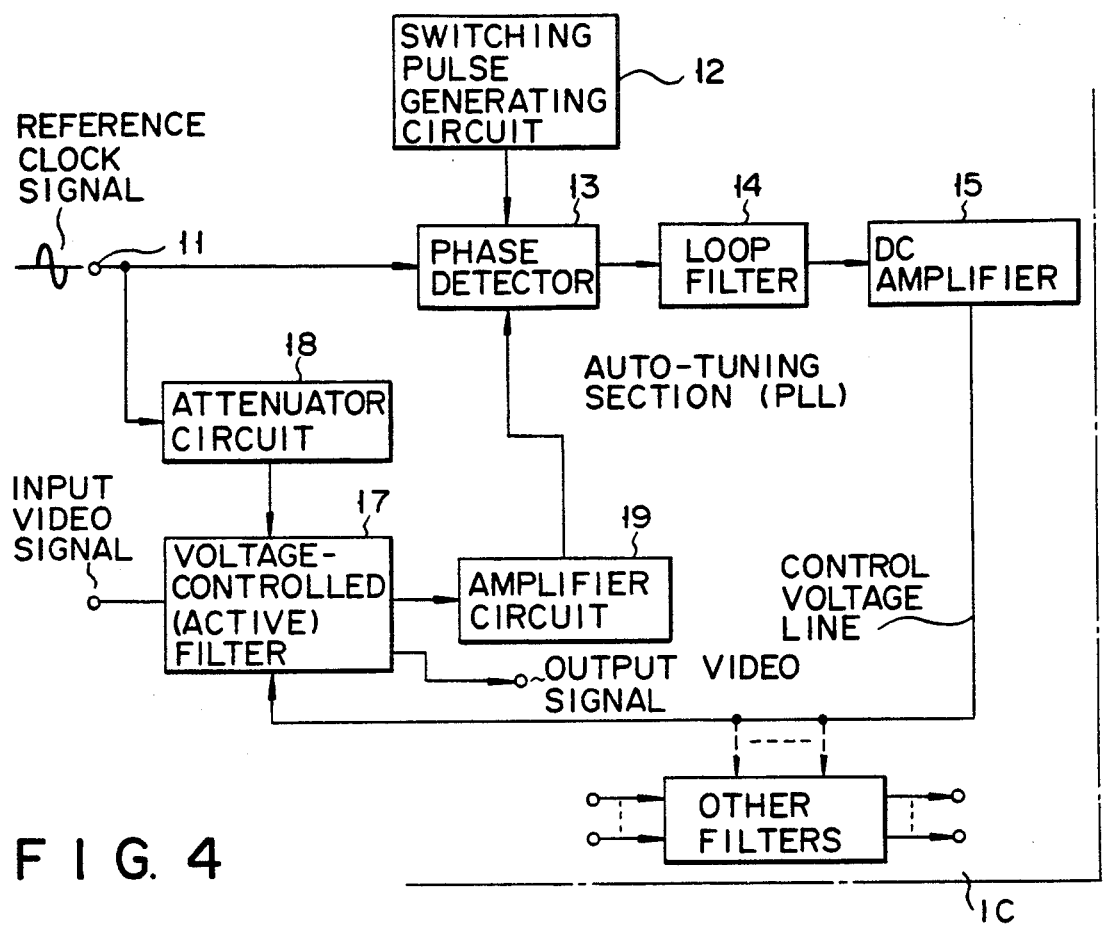
F I G. 4
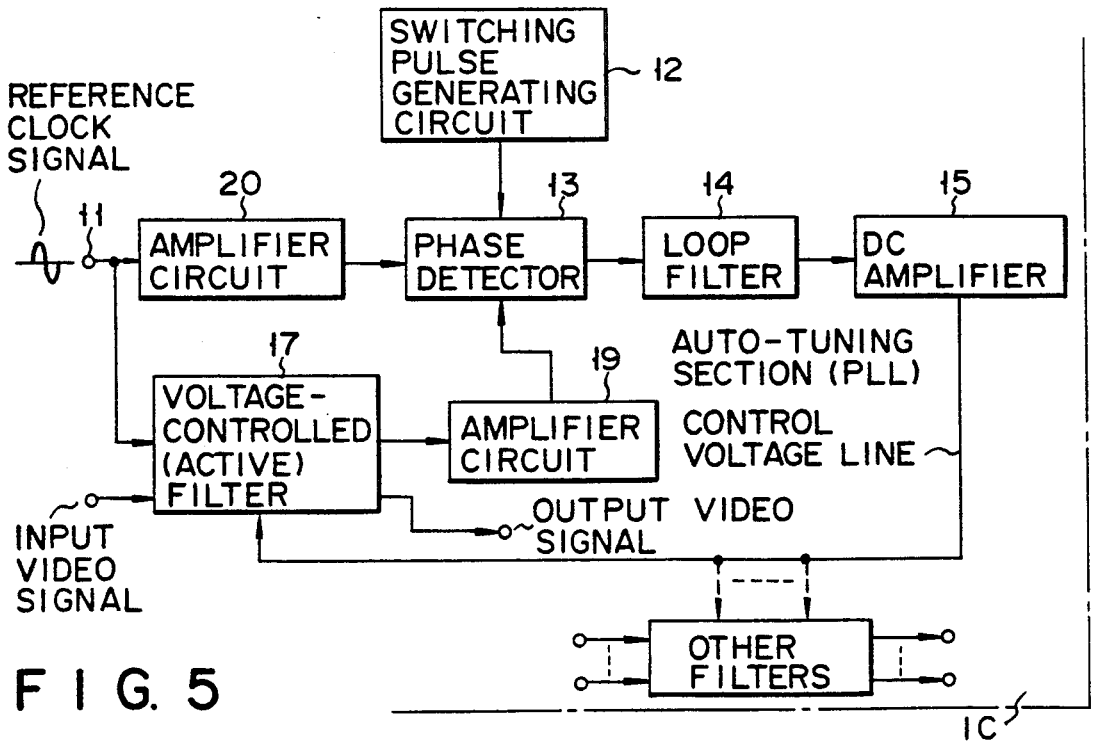
F I G. 5

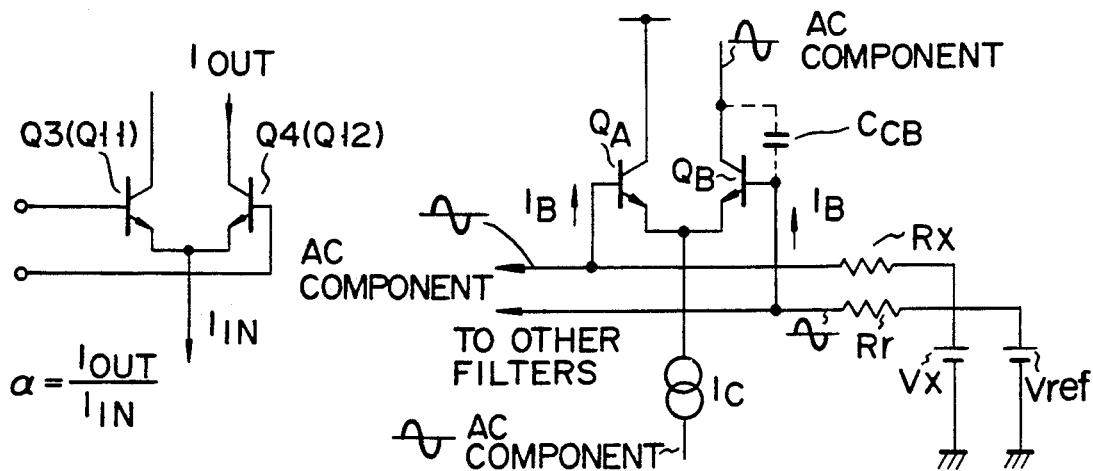
FIG. 10 (PRIOR ART)
FIG. 11 (PRIOR ART)
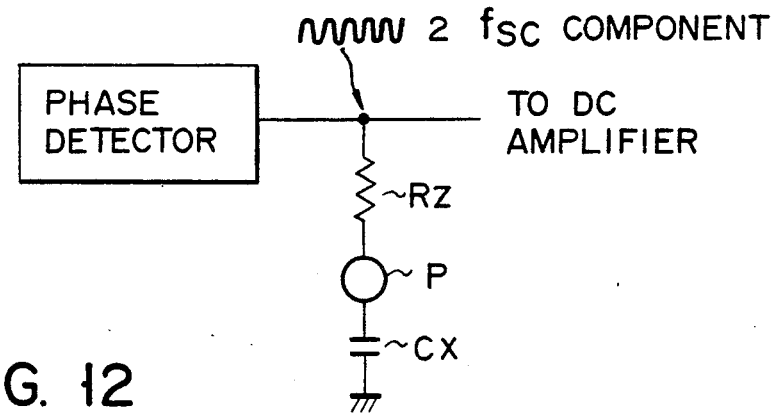
FIG. 12 (PRIOR ART)
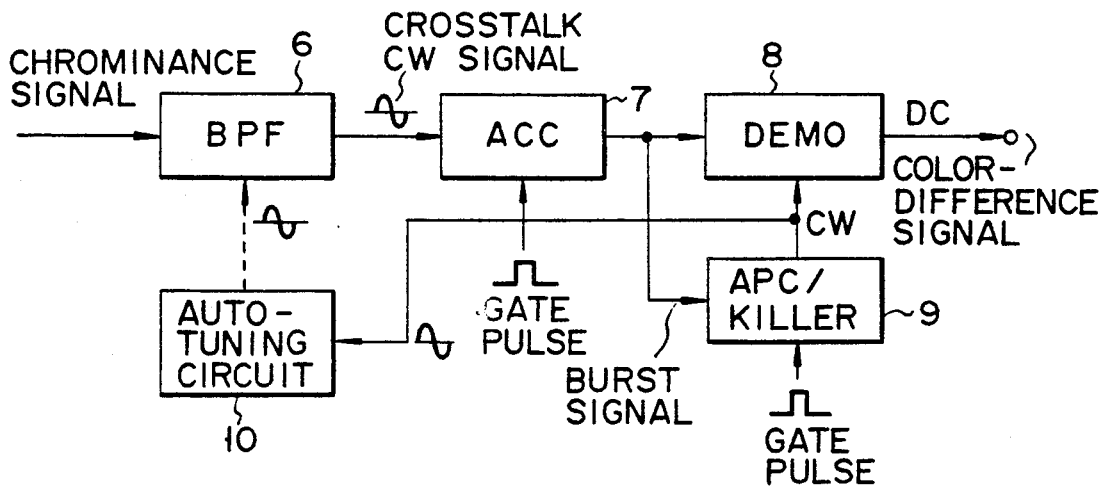
FIG. 13 (PRIOR ART)

AUTO-TUNING CIRCUIT FOR AN ACTIVE FILTER USED IN VIDEO SIGNAL PROCESSING

BACKGROUND OF THE INVENTION

1. Field of the Invention

The present invention generally relates to an auto-tuning circuit for an active filter used in video signal processing. More particularly, it relates to a circuit for automatically tuning an active filter used in a color television (TV) receiver, such as a delay line for delaying video signals or a band-pass filter for limiting the band of chrominance signals.

2. Description of the Related Art

In recent years, the active filtering technology and the semiconductor manufacturing technology have advanced, making it possible to incorporate active filters of video band (0-10 Hz) into an integrated circuit (IC). To incorporate active filters of this type into an IC had been regarded as very difficult.

The resistance, capacitance, etc. of a filter of this type incorporated in an IC, which determine the transfer characteristic thereof, differ about 20% from the design values due to the inadequate control of the IC manufacturing process. Hence, it is necessary to adjust the resistance, capacitance, etc. of the filter built in the IC, e.g., a delay line for delaying Y (luminance) signals or a band-pass filter for filtering chrominance signals.

Additional IC manufacturing steps must be performed to adjust the resistance, capacitance, etc. of the filter incorporated in each IC. Further, these electrical properties of the filter cannot always be adjusted with sufficient accuracy, and may change due to temperature drift. In view of this, it is not necessarily advisable to adjust the resistance, capacitance, etc. of the filter.

Hence, various auto-tuning circuits have been invented which automatically adjust the resistance, capacitance, etc. of a filter built in an IC.

FIG. 6 illustrates one of these circuits, which is a phase-locked loop (PLL) including a conventional voltage-controlled filter.

In this auto-tuning circuit, a reference clock signal A is supplied from an input terminal 1 to a phase detector 2 and a voltage-controlled filter 3. The phase detector 2 compares the phase of the clock signal A with that of the signal B output by the filter 3, and generates a voltage corresponding to the phase difference between the signals A and B. This voltage is applied via a loop filter 4 and a DC amplifier 5 to the voltage-controlled filter 3. The voltage adjusts the transfer characteristic of the filter 3 such that the filter 3 can process an input video signal into a video signal having desired characteristics.

FIG. 7 illustrates the phase detector 2 and the loop filter 4 in detail. The detector 2 comprises a current source $I_0$, a double-balanced differential amplifier comprised of transistors Q01 to Q06, and a current mirror comprised of transistors Q07 and Q08. The reference clock signal A is supplied between the common base of the transistors Q03 and A06 and the common base of the transistors Q04 and Q05. The signal B output by the voltage-controlled filter 3 is supplied between the bases of the transistors Q01 and Q02. An output $I_X$, which corresponds to the phase difference between the signals A and B, is supplied from the collectors of the transistors Q04 and Q06. The output $I_X$ is supplied to the DC amplifier 5 through a capacitor $C_X$ which constitutes the loop filter 4.

The voltage-controlled filter 3 is a delay line or a low-pass filter having such a second-order transfer characteristic, either shifting the phase of the reference clock signal A by 90°.

The operation of the circuit shown in FIGS. 6 and 7 will now be briefly explained, with reference to the timing chart of FIG. 8.

The first signal A input to the phase detector 2 has the waveform A shown in FIG. 8, and the second signal B input to the detector 2 has the waveform B shown in FIG. 8. The second signal B has been generated by passing the first signal A through the voltage-controlled filter 3, thereby phase-shifting the signal A or delaying the same by 135°. Both the first signal A and the second signal B have a sufficient amplitude. The phase detector 2 outputs a current $I_X$ which represents the phase difference between the signals A and B and has the waveform specifically shown at C in FIG. 8. This current $I_X$ is accumulated in and discharged from the capacitor $C_X$ forming the loop filter 4.

As is evident from C in FIG. 8, the electrical charge supplied out of the capacitor $C_X$ is greater than the charged accumulated therein. Hence, the output voltage of the loop filter 4 decreases with time. The output voltage of the loop filter 4 is amplified by the DC amplifier 5 and is then applied to the voltage-controlled filter 3. The filter 3 is designed to shift the phase of the first signal A by an amount proportional to the input voltage. Therefore, the PLL is stabilized when the charge supplied from the capacitor $C_X$ is equal to that accumulated therein, that is, when the signal B is out of phase from the signal A by 90°.

More precisely, the reference clock signal A is a 3.58 MHz signal output by an oscillator (not shown) which is used to demodulate a chrominance signal, and the voltage-controlled filter 3 is a delay line. The transfer characteristic of this delay line is adjusted automatically such that the delay line shifts the phase of the signal A by 90° at the frequency of 3.58 MHz. In other words, the delay line outputs a video signal delayed by about 70 nsec with respect to the input video signal (i.e., a luminance signal).

As is shown in FIG. 6, the control voltage applied to the filter 3 is also applied to the other filters formed in the same IC, whereby these filters are automatically adjusted to have desired transfer characteristics. This is because the resistors and capacitors incorporated in the IC have characteristics different slightly from the design values by only ±1 to 3%. However, this auto-tuning circuit (FIG. 6) has a drawback which will be discussed below.

FIG. 9 illustrates a conventional delay line circuit which is used as a Biquad-type voltage-controlled filter and which is similar to the type disclosed in U.S. Pat. No. 4,748,422. As is shown in FIG. 9, this delay line circuit has transistors Q1 to Q31, resistors R1 to R14, capacitors C1 and C2, a voltage source $V_{CC}$, and a bias source V1. An input signal A is supplied to the base of the transistor Q1, and an output signal B is supplied from the emitter of the transistor Q16. A control voltage $V_X$ is applied to the bases of the transistors Q3, Q11, and Q17. A reference voltage $V_{ref}$ is applied to the bases of the transistors Q4, Q12, and Q18.

Let us determine the transfer function of the filter shown in FIG. 9. Assuming that the resistor R1 has a resistance twice as much as the resistance $\gamma$ of the resistor R2, we obtain:

$$T(s) = \frac{S^2 - \frac{\alpha}{2C_2\gamma} \cdot S + \frac{\alpha^2}{2C_1C_2\gamma^2}}{S^2 + \frac{\alpha}{2C_2\gamma} \cdot S + \frac{\alpha^2}{2C_1C_2\gamma^2}}$$

where $\alpha$ is the transfer coefficient of the control transistors Q3 and Q4 and also that of the control transistors Q11 and Q12, and is less than 1 ($\alpha < 1$).

Obviously, this filter (FIG. 9) has a stable amplitude characteristic and can function as a delay line. It should be noted that the transfer function c, common to the transistors Q3, Q4, Q11, and Q12, is $I_{out}/I_{in}$ as is illustrated in FIG. 10 illustrating a delay line. Also it is apparent that the transfer coefficient $\alpha$ can be adjusted by changing the control voltage $V_X$, whereby the transfer function (i.e., the delay time) of the delay line is changed.

Let us now discuss the influence of the crosstalk component of the signal leaked through the control voltage line connected to the voltage-controlled filter 3, with reference to FIG. 11 which shows a circuit for controlling the transfer function of the filter illustrated in FIG. 9. The circuit shown in FIG. 11 has two lines connected to the control voltage source $V_X$ and the reference voltage source $V_{ref}$ and having output impedances $R_r$ and $R_x$. It further comprises transistors $Q_A$ and $Q_B$ whose bases are connected to the lines, respectively, and a current source $I_C$ for these transistors $Q_A$ and $Q_B$. When the current from the current source $I_C$ contains an AC component resulting from the input signal A, the emitter currents of the transistors component $Q_A$ and $Q_B$ connected to the voltage sources $V_X$ and $V_{ref}$ change, thereby changing the base currents $I_B$ of both transistors $Q_A$ and $Q_B$. Consequently, the current $I_B$ and the impedances $R_r$ and $R_x$ cause a voltage drop, and the AC component is inevitably supplied through the control voltage lines.

Further, a signal component is supplied to the collector of the transistor $Q_B$. As a result of this, a high-band component leaks into the bias line for applying the reference voltage $V_{ref}$, due to the base-collector parasitic capacitance $C_{CB}$ of the transistor $Q_B$. Hence, the reference clock signal for adjusting the transfer function of the delay line is a 3.58 MHz signal for demodulating chrominance signals, the 3.58 MHz component will leak into the delay lines for processing luminance signals. This 3.58 MHz component will result in slant stripes appearing on the CRT screen of a TV receiver, and should therefore be removed. The parasitic capacitance $C_{CB}$ will affect the other bias lines in the same manner.

The loop filter 4 is connected between the phase detector 2 and the AC amplifier 5. The transfer characteristic of this filter 4 can be altered by external means. Therefore, in most cases, the capacitor $C_X$ is provided outside the IC and connected to the IC. More precisely, as is shown in FIG. 12, the capacitor $C_X$ is connected by a terminal pin P to aluminum wire connecting the phase detector 2 and the DC amplifier 5. An impedance $R_Z$ is provided between the terminal pin P and the aluminum wire, because of the other aluminum wires formed in the IC, the bonding wires connecting the IC and the chip frame, and the chip frame itself. Hence, while the phase detector 2 is comparing the signals A and B, the clock component at the input of the DC amplifier is twice as much (2 fsc) and leaks to the delay line. This clock component will result in slant stripes appearing on the CRT screen of the TV receiver, too.

As has been mentioned, in the conventional circuit shown in FIG. 11, both the reference clock component and the clock component twice as much as the reference clock component leak to the filters processing the video signals. As a consequence, slant stripes appear on the CRT screen of the TV receiver.

When the conventional auto-tuning circuit 10 is connected to a band-pass filter (BPF) 6 for processing chrominance signals as is shown in FIG. 13, and a 3.58 MHz signal is used as a reference clock signal, the 3.58 MHz clock signal leaks all the time the circuit 10 is operating. The band-pass filter 6, which is an active filter, inevitably generates a crosstalk signal CW. The crosstalk signal CW is supplied to a color signal demodulating circuit (DEMO) 8 through an automatic color control circuit (ACC) 7. Hence, the DEMO 8 demodulates the signal CW, adversely influencing a color-difference signal DC and ultimately impairing the white balance on the CRT screen. Further, the crosstalk signal CW is supplied from the ACC 7 also to a color killer circuit 9, along with a burst signal, inevitably causing the color killer circuit 9 to make errors.

The above description is limited to the case where the conventional auto-tuning circuit is used to control a voltage-controlled filter. Nevertheless, the conventional auto-tuning circuit can be used to control a current-controlled filter, in which case, too, the circuit will make the same problems as mentioned above.

SUMMARY OF THE INVENTION

It is, therefore, an object of the present invention to provide a new and improved auto-tuning circuit for an active filter used in video signal processing, which can automatically adjust the active filter with high efficiency, without forming slant stripes on a CRT screen or impairing white balance on the CRT screen.

According to one aspect of the present invention, there is provided an auto-tuning circuit for an active filter used in video signal processing, said circuit comprising:

a voltage-controlled filter used as an active filter for imparting a predetermined transfer characteristic to a signal having a component related to a television signal, said transfer characteristic being adjustable in accordance with a voltage;

PLL means connected to the voltage-controlled filter, for applying to the voltage-controlled filter a control voltage corresponding to the phase difference between a reference signal and an output signal obtained by passing the reference signal through the voltage-controlled filter; and switching means for allowing transfer of signals between the voltage-controlled filter and the PLL means during at least one of the horizontal blanking periods or vertical blanking periods of the television signal.

According to another aspect of this invention, there is provided an auto-tuning circuit for a plurality of active filters used in video signal processing, said circuit comprising:

a plurality of voltage-controlled filters used as active filters for imparting a plurality of predetermined transfer characteristics to signals having a component related to a television signal, said transfer characteristics being adjustable in accordance with a voltage;

PLL means connected to at least one of the plurality of voltage-controlled filters, for applying to all of the plurality of voltage-controlled filters a control voltage corresponding to the phase difference between a reference signal and an output signal obtained by passing the reference signal through at least one voltage-controlled filter; and switching means for allowing transfer of signals between the PLL means and at least one voltage-controlled filter for at least one of the horizontal blanking periods and vertical blanking periods of the television signal.

According to still another aspect of the present invention, there is provided a filter auto-tuning circuit comprising:

an active filter whose transfer function can be changed in accordance with a control voltage or a control current;

a phase detecting circuit for detecting the phase of a first reference signal and that of a second reference signal and outputting a signal representing the phase difference between the first and second reference signals;

first means for supplying a signal output by a reference signal source to the phase detecting circuit through a first signal path, as first reference signal;

second means for supplying the signal output by the reference signal source to the phase detecting circuit through a second signal path, as second reference signal;

a loop filter for smoothing the signal output by the phase detecting circuit;

a direct-current amplifier for supplying the active filter with a voltage or current for controlling the transfer function of the active filter, said voltage or current being generated from the voltage output by said loop filter; and third means for operating the phase detecting circuit during the horizontal blanking period or vertical blanking period of a television signal.

In the present invention, when the active filter, which is controlled by either a voltage or a current, is used in processing Y signals, a reference clock signal has duration equal to the blanking period of the television signal, and the phase detecting circuit is operated during the blanking period of the television signal. Hence, a leakage component, if output from the auto-tuning circuit, will not adversely influence the quality of the image displayed on a CRT screen. On the other hand, when the active filter is used in processing chrominance signals, the phase comparing circuit is operated during the blanking period of the television signal, excluding the burst period. This is because a leakage component, if output from the auto-tuning circuit, may adversely influence the burst signal to cause color drift or the like. Hence, a leakage component, if any, will not adversely influence the quality of the image displayed on a CRT screen.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, show presently preferred embodiments of the invention and, together with the general description given above and the detailed description of the preferred embodiments given below, serve to explain the principles of the invention.

FIG. 1 is a block diagram showing an auto-tuning circuit for an active filter, which is a first embodiment of the present invention;

Figure 6:
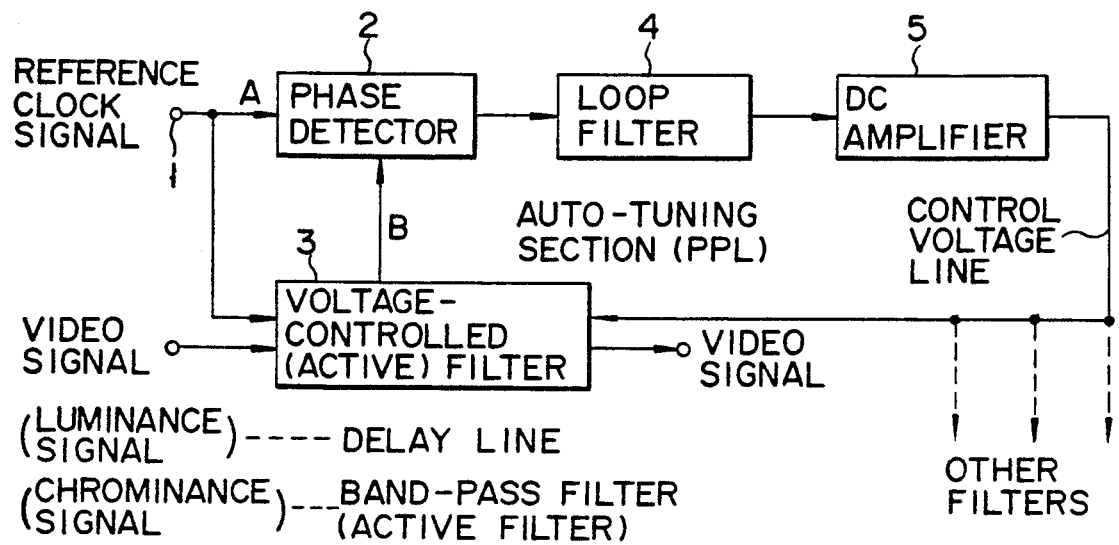
Figure 7:
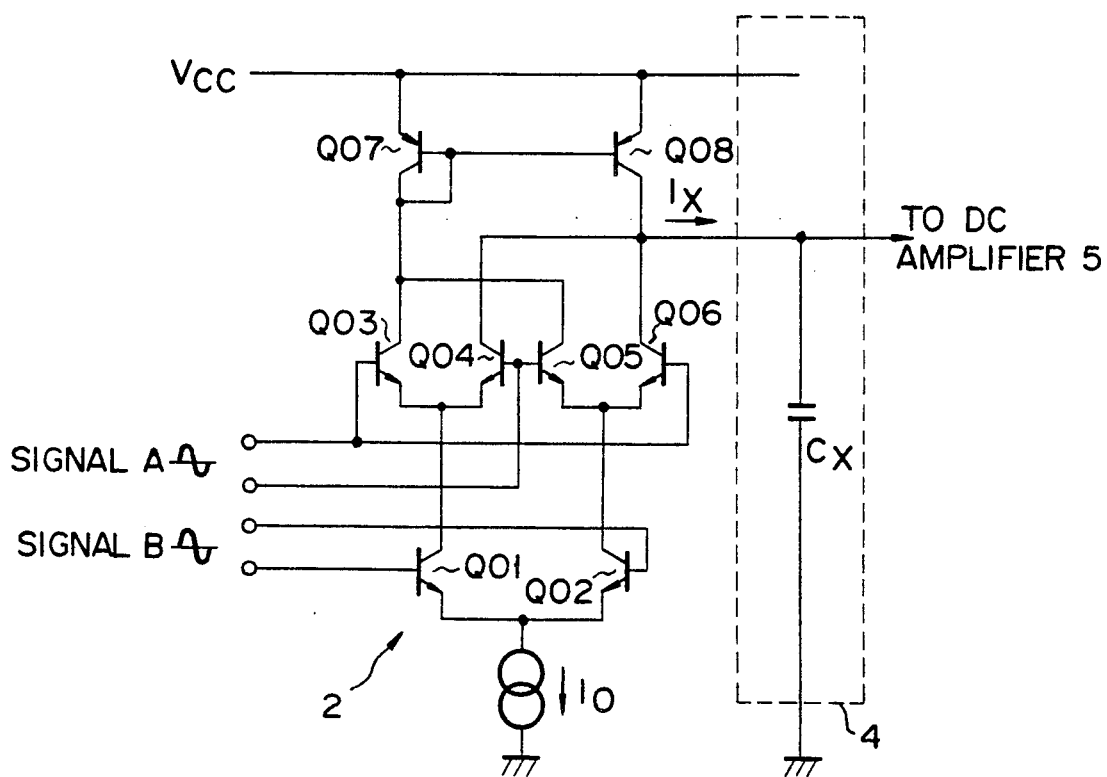
Figure 8:
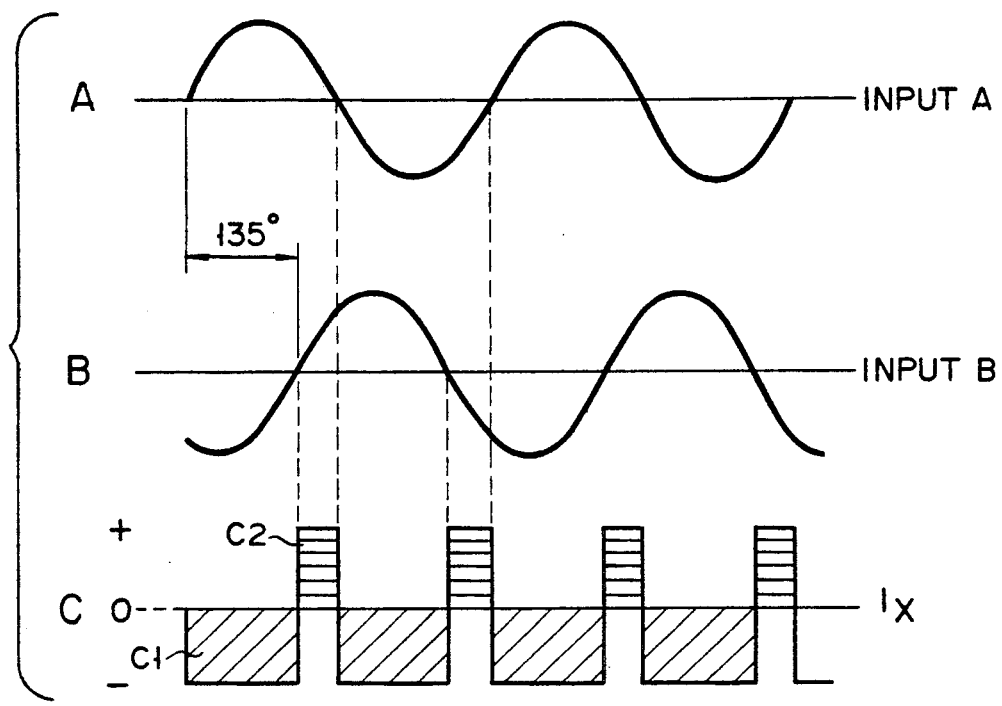
Figure 9:
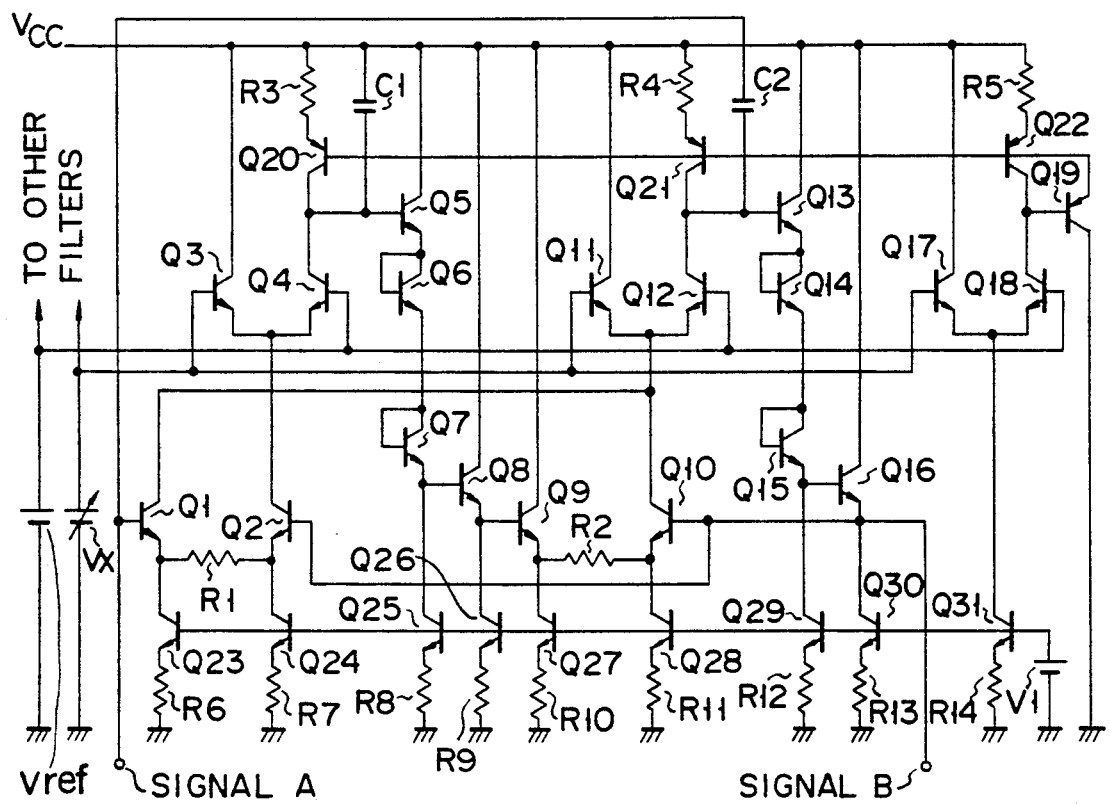

2B is a circuit diagram showing a switching circuit of another type, which can be incorporated in the auto-tuning circuit shown in FIG. 1;

FIGS, 2C, 2D, 2E and 2F are circuit diagrams illustrating various circuits for generating switching pulses;

FIG. 3 is a timing chart representing the time relationship among the signals used and generated in the circuit illustrated in FIG. 2F;

FIG. 4 is a block diagram showing an auto-tuning circuit for an active filter, which is a second embodiment of the present invention;

FIG. 5 is a block diagram illustrating an auto-tuning circuit for an active filter, which is a third embodiment of the present invention;

FIG. 6 is a block diagram showing a conventional auto-tuning circuit for an active filter;

FIG. 7 is a circuit diagram showing the phase comparing circuit incorporated in the circuit illustrated in FIG. 6;

FIG. 8 is a timing chart explaining the operation of the phase comparing circuit illustrated in FIG. 7;

FIG. 9 is a circuit diagram illustrating a voltage-controlled filter;

FIG. 10 is a diagram showing the circuit for controlling the transfer function of the filter shown in FIG. 9;

FIG. 11 is an equivalent circuit diagram of the circuit shown in FIG. 10;

FIG. 12 is an equivalent circuit diagram of a loop filter formed in an IC; and

FIG. 13 is a block diagram illustrating a circuit for processing chrominance signals, wherein the conventional auto-tuning circuit is used to control a band-pass filter (BPF) for processing the chrominance signals, and explaining how a leakage of the reference clock signal adversely influences the quality of the image on a CRT screen.

DETAILED DESCRIPTION OF THE PREFERRED EMBODIMENTS

Reference will now be made in detail to the presently preferred embodiments of the invention as illustrated in the accompanying drawings, in which like reference characters designate like or corresponding parts throughout the several drawings.

FIG. 1 is a block diagram showing an auto-tuning circuit for an active filter, which is the first embodiment of the present invention.

A reference clock signal is supplied to an input terminal 11, and further to a phase detector 13 and a switch circuit 16. A switching pulse generating circuit 12 supplies switching pulses to the phase detector 13. For a period of time corresponding to the width of each pulse, the phase detector 13 compares the phase of the reference clock signal with that of a signal output by a voltage-controlled filter 17. Also, for this period of time, the switch circuit 16 supplies the reference clock signal to the voltage-controlled filter 17.

The voltage-controlled filter 17 is an active filter whose transfer characteristic changes in accordance with the control voltage applied from an DC amplifier 15. The filter 17 has a second-order transfer function, and is a delay line as in the conventional circuit illustrated in FIG. 6. Alternatively, it can be a low-pass filter.

Figure 2C:
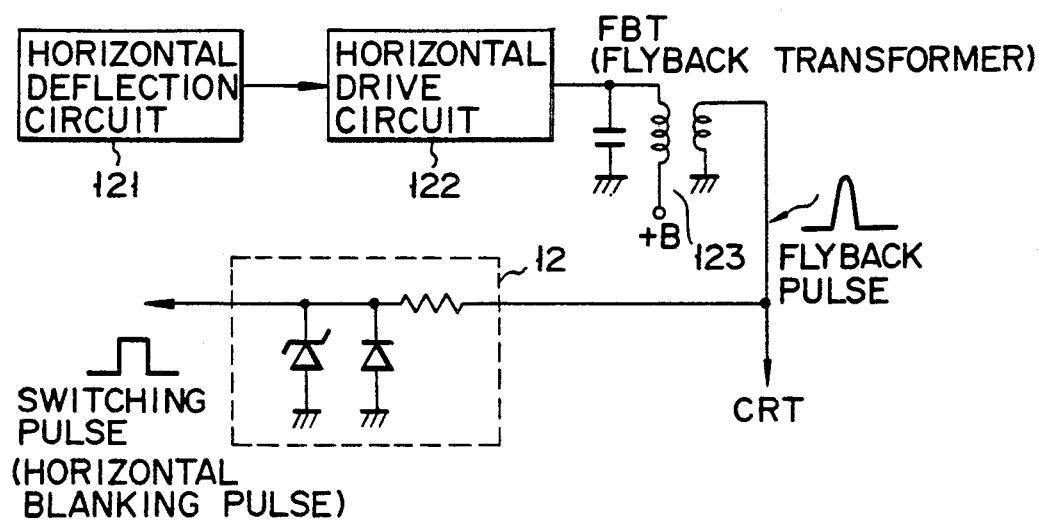
FIG. 2A is a circuit diagram showing a switching circuit incorporated in the auto-tuning circuit shown in FIG. 1.

In the embodiment shown in FIG. 1, the voltage-controlled filter 17, which is a delay line, is used in processing Y (luminance) signals in a color television (TV) receiver. The switching pulse generating circuit 12 is therefore of the same type that generates horizontal blanking pulses from the fly back pulses supplied from a flyback transformer (FBT) 123 which is, as is shown in FIG. 2C, driven by a horizontal deflection circuit 121 and a horizontal drive circuit 122. The reference clock signal supplied to the input terminal 11 is the stable oscillation signal which is generated in the color TV receiver and has a frequency of 3.58 MHz. As has been described, the 3.58 MHz clock signal is supplied from the input terminal 11 to the phase detector 13 and the switch circuit 16.

The phase detector 13 will be described in detail, with reference to FIG. 2A. As shown in this figure, the phase detector 13 comprises a double-balance differential amplifier comprised of transistors Q41 to Q46, a current mirror comprised of transistors Q47 to Q49, a current-source transistor Q50, resistors R21 to R23, and two bias sources V11 and V12. Further, the phase detector 13 has a reference clock input terminal 31, a switching pulse terminal 32, an input terminal 33, and an output terminal 34. The terminal 31 receives the reference clock signal from the input terminal 11. The terminal 32 receives the switching pulses from the pulse generating circuit 12. The terminal 33 receives the signal output by the voltage-controlled filter 17 The terminal 34 supplies a signal representing the phase difference between the Y signal and the output signal of the DC amplifier 15.

The phase detector 13 operates in the same way as the phase detector 2 (FIG. 7) used in the conventional auto-tuning circuit shown in FIG. 6, except for the following point. While the switching pulse signal supplied to the input terminal 32 remains at a high level, the transistor Q50 is on, whereby a current is supplied to the phase detector 13, and the detector 13 therefore compares the phase of the reference clock signal and that of the signal output by the filter 17. Conversely, while the switching pulse signal supplied to the terminal 32 remains at a low level, the transistor Q50 is off, whereby no currents are supplied to the phase detector 13, and the detector 13 cannot compare the phase of the reference clock signal and that of the signal output by the filter 17.

The switch circuit 16 will be described in detail, with reference to FIG. 2B. As is illustrated in this figure, the switch circuit 16 comprises a differential amplifier comprised of transistor Q51 to Q56, a current mirror comprised of Q57 and Q58, an output transistor Q59, current sources I11 to I13, a reference voltage source V13, a bias source V14, and two resistors R24 and R25. The switch circuit also has an input terminal for receiving the reference clock signal, an input terminal for receiving the switching pulses, and an output terminal 43 for outputting a signal. While the switching pulse signal supplied to the input terminal 42 is at the high level, the terminal 43 outputs a reference clock signal at the high level. While the switching pulse signal is at the low level, the terminal 43 outputs the reference voltage applied from the reference voltage source V13.

The loop filter 14, the DC amplifier 15, and the voltage-controlled filter 17, which constitute the auto-tuning circuit (FIG. 1), along with the pulse generating circuit 12, the phase detector 13, and the switch circuit 16, are identical to their counterparts 3, 4, and 5 of the conventional auto-tuning circuit illustrated in FIG. 6. Further, the voltage-controlled filters other than the filter 17, which are formed in the same IC, are of the same type as those incorporated in the conventional auto-tuning circuit (FIG. 1).

In operation, while the switching pulse signal is at the high level, that is, during the horizontal blanking period, the reference clock signal (i.e., the 3.58 MHz signal) is input to the voltage-controlled filter 17, and the phase detector 13 performs its function. On the other hand, while the switching pulse signal is at the low level, that is, during the period other than the horizontal blanking period, the 3.58 MHz signal is not input to the filter 17, and the phase detector 13 is stopped. Hence, it is during the horizontal blanking period that a 3.58 MHz signal component may leak into the control voltage line connected to the DC amplifier 15 or the bias line common to the other filters. Should a 3.58 MHz signal component leak during the horizontal blanking period, it would not impair the quality of the image displayed on the CRT screen of the TV receiver.

FIG. 4 is a block diagram showing an auto-tuning circuit for an active filter, which is the second embodiment of the present invention. This auto-tuning circuit is identical to the circuit shown in FIG. 1, except for three points. First, it has no components equivalent to the switch circuit 16. Second, a circuit 18 for attenuating the reference clock signal is connected to the input of a voltage-controlled filter 17. Third, an amplifier circuit 19 is connected to the output of the voltage-controlled filter 17.

In the second embodiment, the smaller the amplitude of the reference clock signal supplied to the filter 17, the smaller the signal component leaking to the other filters formed in the same IC will be. Thus, there will be no problems as far as the quality of the image on the CRT screen is concerned, if the amplitude of the reference clock signal is reduced so much that the signal component leaking to the other filters is too small to be detected. However, when the clock signal having so small an amplitude is supplied from the filter 17 to a phase detector 13, the phase detector 13 may fail to perform its function well (that is, its operating efficiency may decrease while the differential circuit used in the detector 13 operates in a linear region). In order to prevent such malfunction of the detector 13, the amplifier 19 is connected between the voltage-controlled filter 17 and the phase detector 13.

FIG. 5 is a block diagram showing an auto-tuning circuit for an active filter, which is the third embodiment of the present invention. This circuit is a modification of the auto-tuning circuit shown in FIG. 4, and is characterized in two respects. First, the amplitude of the reference clock signal supplied to an input terminal 11 is reduced, thus decreasing the signal component leaking to the filters other than a voltage-controlled filter 17 thereby to prevent deterioration of image quality. Second, this clock signal is amplified by amplifiers 20 and 19 to such a degree that a phase detector 13 performs its function well.

The switching pulse generating circuit 12 need not be limited to the type illustrated in FIG. 2C. One of the other types of circuits, which are shown in FIGS. 2D, 2E, and 2F can be used in accordance with the one in which the active filter is used.

Figure 2D:
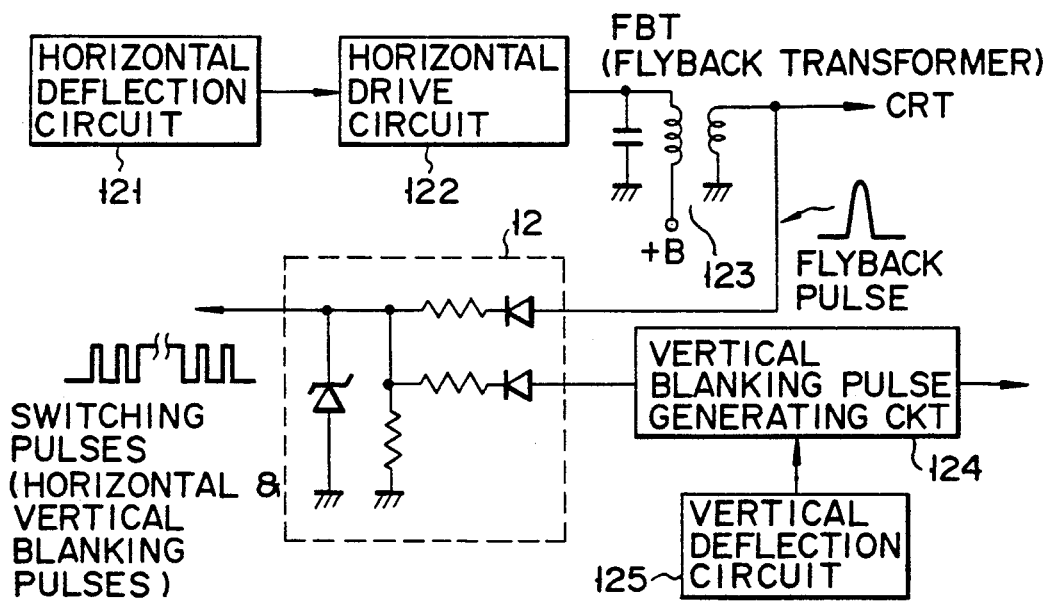
Figure 2E:
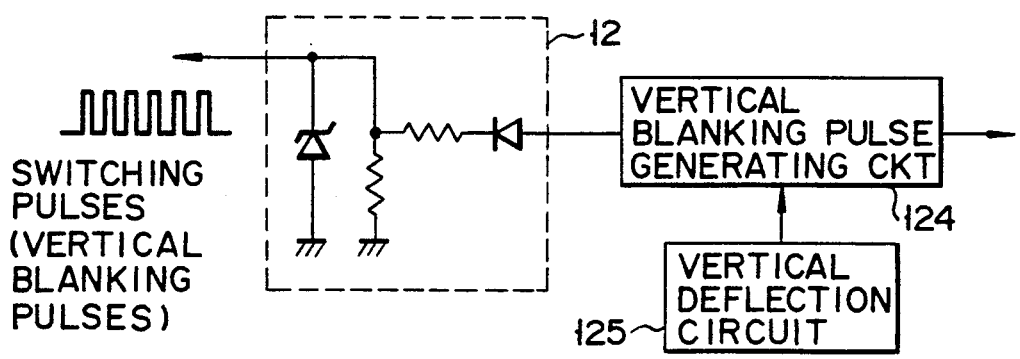

More specifically, the switching pulse generating circuit shown in FIG. 2D or 2E is used, like the circuit shown in FIG. 2D, in the case where the active filter 17 built in the IC is employed to process Y signals (i.e., luminance signals). The circuit of FIG. 2D is designed to generate switching pulses by superimposing vertical blanking pulses on horizontal blanking pulses, the vertical blanking pulses being supplied from a vertical blanking pulse generating circuit 124. The circuit of FIG. 2E is designed to generate switching pulses from only the vertical blanking pulses output by a vertical blanking pulse generating circuit 124

The switching pulse generating circuit shown in FIG. 2F is used in the case where the active filter 17 built in the IC is employed to process C signals (i.e., chrominance signals) and composite video signals. The circuit comprises a monostable multivibrator. The monostable multivibrator is triggered by a flyback pulse 1 of the same type supplied to the circuit 12 of FIG. 2C, and generates a switching pulse 2 which is, as is shown in FIG. 3, at the high level during the horizontal blanking period but not during the chroma-burst period.

As may be understood from the above, the switching pulse generating circuit 12 supplies a reference clock pulse via the switch circuit 16 to the active filter 17 and also directly to the phase detector 13, said pulse being at the high level during the horizontal blanking period, the vertical blanking period, or a selected part thereof. Hence, the active filter 17 can be automatically adjusted such that leakage components, if any, will not impair the quality of the image displayed on a CRT screen.

As has been described, the auto-tuning circuit according to the present invention can automatically adjust an active filter used in processing video signals, without forming slant stripes on a CRT screen or impairing white balance on the CRT screen.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. An auto-tuning circuit for an active filter used in video signal processing, said circuit comprising:
   a voltage-controlled filter used as an active filter for imparting a predetermined transfer characteristic to a signal having a component related to a television signal, said transfer characteristic being adjustable in accordance with a voltage;
   PLL means connected to said voltage-controlled filter, for applying to said voltage-controlled filter a control voltage corresponding to the phase difference between a reference signal and an output signal obtained by passing the reference signal through said voltage-controlled filter; and
   switching means for allowing transfer of signals between said voltage-controlled filter and said PLL means during at least one horizontal blanking period or vertical blanking period of the television signal.

2. The auto-tuning circuit according to claim 1, wherein said PLL means comprises:
   a phase detecting circuit for detecting the phase of a first reference signal and that of a second reference signal and outputting a signal representing the phase difference between the first and second reference signals;
   first means for supplying a signal output by a reference signal source to said phase detecting circuit through a first signal path, as first reference signal;
   second means for supplying the signal output by said reference signal source to said phase detecting circuit through a second signal path, as second reference signal, said second signal path including said voltage-controlled filter;
   a loop filter for smoothing the signal output by said phase detecting circuit; and
   a direct-current amplifier for supplying said voltage-controlled filter with a voltage or current for controlling the transfer function of said voltage-controlled filter, said voltage or current being generated from the voltage output by said loop filter.

3. The auto-tuning circuit according to claim 2, wherein said first means supplies the signals from said reference signal source, directly to said phase detecting circuit; and said second mean attenuates the signals from said reference signal source, amplifies the signals after the signals have passed through said voltage-controlled filter, and supplies the amplified signals to said phase detecting circuit.

4. The auto-tuning circuit according to claim 2, wherein said reference signal source generates attenuated reference signals; said first means amplifies and supplies the attenuated signals directly to said phase detecting circuit; and said second means amplifies the attenuated signals after the signals have passed the voltage-controlled filter, and then supplies the amplified signals to said phase detecting circuit.

5. The auto-tuning circuit according to claim 2, wherein said second signal path includes control means for allowing the supply of the reference signals to said voltage-controlled filter only while said phase detecting circuit is operating.

6. The auto-tuning circuit according to claim 1, wherein said switching means allows for transfer of signals between said voltage-controlled filter and said PLL means during the horizontal blanking period, when the signal containing the component related to the television signal is a luminance signal.

7. The auto-tuning circuit according to claim 1, wherein said switching means allows for transfer of signals between said voltage-controlled filter and said PLL means during both the horizontal blanking period and the vertical blanking period, when the signal containing the component related to the television signal is a luminance signal.

8. The auto-tuning circuit according to claim 1, wherein said switching means allows for transfer of signals between said voltage-controlled filter and said PLL means during the vertical blanking period, when the signal containing the component related to the television signal is a luminance signal.

9. The auto-tuning circuit according to claim 1, wherein said switching means allows for transfer of signals between said voltage-controlled filter and said PLL means during the horizontal blanking period minus a chroma-burst period, when the signal containing the component related to the television signal is a chrominance signal.

10. The auto-tuning circuit according to claim 1, wherein said switching means allows for transfer of signals between said voltage-controlled filter and said PLL means during the horizontal vertical blanking period minus a chroma-burst period, when the signal containing the component related to the television signal is a composite video signal.

11. An auto-tuning circuit for a plurality of active filters formed within the same IC and used in video signal processing, said circuit comprising:
  a plurality of voltage-controlled filters used as active filters for imparting predetermined transfer characteristics to signals having components related to a television signal, said transfer characteristics being adjustable in accordance with a voltage;
  PLL means connected to at least one of said plurality of voltage-controlled filters, for applying to all of said plurality of voltage-controlled filters a control voltage corresponding to the phase difference between a reference signal and an output signal obtained by passing the reference signal through said at least one voltage-controlled filter; and
  switching means for allowing transfer of signals between at least one said voltage-controlled filter and said PLL means during at least one horizontal blanking period or vertical blanking period of the television signal.

12. The auto-tuning circuit according to claim 11, wherein said PLL means comprises:
  a phase detecting circuit for detecting the phase of a first reference signal and that of a second reference signal and outputting a signal representing the e phase difference between the first and second reference signals;
  first means for supplying a signal output by a reference signal source to said phase detecting circuit through a first signal path, as first reference signal;
  second means for supplying the signal output by said reference signal source to said phase detecting circuit through a second signal path, as second reference signal, second signal path including said at least one said voltage-controlled filter;
  a loop filter for smoothing the signal output by said phase detecting circuit; and
  a direct-current amplifier for supplying at least one said voltage-controlled filter with a voltage or current for controlling the transfer function of at least one said voltage-controlled filter, said voltage or current being generated from the voltage output by said loop filter.

13. The auto-tuning circuit according to claim 12, wherein said first means supplies the signals from said reference signal source, directly to said phase detecting circuit; and said second means attenuates the signals from said reference signal source, amplifies the signals after the signals have passed through at least one said voltage-controlled filter, and supplies the amplified signals to said phase detecting circuit.

14. The auto-tuning circuit according to claim 12, wherein said reference signal source generates attenuated reference signals; said first means amplifies and supplies the attenuated signals directly to said phase detecting circuit; and said second means amplifies the attenuated signals after the signals have passed at least one said voltage-controlled filter, and then supplies the amplified signals to said phase detecting circuit.

15. The auto-tuning circuit according to claim 12, wherein said second signal path includes control means for allowing the supply of the reference signals to at least one said voltage-controlled filter only while said phase detecting circuit is operating.

16. The auto-tuning circuit according to claim 11, wherein said switching means allows for transfer of signals between at least one said voltage-controlled filter and said PLL means during the horizontal blanking period, when the signal containing the component related to the television signal is a luminance signal.

17. The auto-tuning circuit according to claim 11, wherein said switching means allows for transfer of signals between at least one said voltage-controlled filter and said PLL means during both the horizontal blanking period and the vertical blanking period when the signal containing the component related to the television signal is a luminance signal.

18. The auto-tuning circuit according to claim 11, wherein said switching means allows for transfer of signals between at least one said voltage-controlled filter and said PLL means during the vertical blanking period, when the signal containing the component related to the television signal is a luminance signal.

19. The auto-tuning circuit according to claim 11, wherein said switching means allows for transfer of signals between at least one said voltage-controlled filter and said PLL means during the horizontal blanking period minus a chroma-burst period, when the signal containing the component related to the television signal is a chrominance signal.

20. The auto-tuning circuit according to claim 11, wherein said switching means allows for transfer of signals between at least one said voltage-controlled filter and said PLL means during the horizontal vertical blanking period minus a chroma-burst period, when the signal containing the component related to the television signal is a composite video signal.

21. A filter auto-tuning circuit comprising:
  an active filter whose transfer function can be changed in accordance with a control voltage or a control current;
  a phase detecting circuit for detecting the phase of a first reference signal and that of a second reference signal and outputting a signal representing the phase difference between the first and second reference signals;
  first means for supplying a signal output by a reference signal source to the phase detecting circuit through a first signal path, as first reference signal;
  second means for supplying the signal output by the reference signal source to the phase detecting circuit through a second signal path, as second reference signal;
  a loop filter for smoothing the signal output by the phase detecting circuit;
  amplifier for supplying the active
  a direct-current filter with a voltage or current for controlling the transfer function of the active filter, said voltage or current being generated from the voltage output by said loop filter; and
  third means for operating the phase detecting circuit during the horizontal blanking period or vertical blanking period of a television signal.

* * * * *